United States Patent
Snoeij et al.

(10) Patent No.: US 10,574,252 B2
(45) Date of Patent: *Feb. 25, 2020

(54) FREQUENCY MANAGEMENT FOR INTERFERENCE REDUCTION OF A/D CONVERTERS POWERED BY SWITCHING POWER CONVERTERS

(71) Applicant: TEXAS INSTRUMENTS INCORPORATED, Dallas, TX (US)

(72) Inventors: Martijn Fridus Snoeij, Erding (DE); Mikhail Valeryevich Ivanov, Freising (DE); Roberto Giampiero Massolini, Pavia (IT); Brian David Johnson, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,198

(22) Filed: Dec. 27, 2018

(65) Prior Publication Data

US 2019/0158105 A1      May 23, 2019

Related U.S. Application Data

(63) Continuation of application No. 15/395,212, filed on Dec. 30, 2016, now Pat. No. 10,218,374.

(51) Int. Cl.
| | |
|---|---|
| *H03L 7/08* | (2006.01) |
| *H03M 1/12* | (2006.01) |
| *H03M 1/08* | (2006.01) |
| *H03L 7/18* | (2006.01) |

(52) U.S. Cl.
CPC .............. *H03M 1/124* (2013.01); *H03L 7/08* (2013.01); *H03L 7/18* (2013.01); *H03M 1/0845* (2013.01); *H03M 1/12* (2013.01)

(58) Field of Classification Search
CPC ................................ H03M 1/124; H03L 7/08
See application file for complete search history.

(56) References Cited

U.S. PATENT DOCUMENTS

| | | |
|---|---|---|
| 7,015,702 B2 | 3/2006 | Rupp |
| 8,649,534 B2 | 2/2014 | Wu et al. |
| 9,456,257 B2 | 9/2016 | Mukhopadhyay et al. |
| 9,544,027 B2 | 1/2017 | Cornell et al. |
| 9,634,567 B2 | 4/2017 | Oliaei |
| 10,218,374 B2 * | 2/2019 | Snoeij .................. H03M 1/124 |

* cited by examiner

*Primary Examiner* — Kenneth B Wells
(74) *Attorney, Agent, or Firm* — John R. Pessetto; Charles A. Brill; Frank D. Cimino

(57) ABSTRACT

In at least some embodiments, a system comprises a frequency generator configured to generate a second clock signal having a second frequency using a first clock signal having a first frequency. The second frequency is offset from the first frequency and each of a plurality of harmonic frequencies of the second frequency is offset from a harmonic frequency of the first frequency. The system also includes a power converter configured to produce a power signal that at least partially corresponds to the second frequency. The system further comprises an analog-to-digital converter (ADC) configured to sample and convert analog voltages at the first frequency. The ADC is powered by the power signal.

3 Claims, 2 Drawing Sheets

FREQUENCY MANAGEMENT FOR INTERFERENCE REDUCTION OF A/D CONVERTERS POWERED BY SWITCHING POWER CONVERTERS

CROSS REFERENCE TO RELATED APPLICATION(S)

This continuation application claims priority to U.S. patent application Ser. No. 15/395,212, filed Dec. 30, 2016, now U.S. Pat. No. 10,218,374, issued Feb. 26, 2019, which application is incorporated herein by reference in its entirety.

BACKGROUND

Certain technologies, such as industrial and automotive applications, commonly carry high currents (e.g., 1 A or more). It is often necessary to measure such high currents without unnecessary and potentially harmful exposure to people or other systems and circuitry. Electrically isolated current-sensing devices may be used to measure voltages across a shunt resistor that carries a high current and such voltages may later be used to calculate the current amplitude. However, such devices typically lack integrated, isolated power supplies that power the front-end shunt readout circuitry, and they often suffer from noise and aliasing problems between their internal clocks and externally-sourced power signals.

SUMMARY

In at least some embodiments, a system comprises a frequency generator configured to generate a second clock signal having a second frequency using a first clock signal having a first frequency. The second frequency is offset from the first frequency and each of a plurality of harmonic frequencies of the second frequency is offset from a harmonic frequency of the first frequency. The system also includes a power converter configured to produce a power signal that at least partially corresponds to the second frequency. The system further comprises an analog-to-digital converter (ADC) configured to sample and convert analog voltages at the first frequency. The ADC is powered by the power signal. Such embodiments may be supplemented using one or more of the following concepts in any order and in any combination: wherein at least a portion of the power converter is electrically isolated from the frequency generator; wherein at least a portion of the power converter is electrically isolated from the ADC; wherein the ADC is electrically isolated from the frequency generator; wherein the power converter comprises a laminated transformer component to achieve electrical isolation between at least part of the power converter and another portion of the system; wherein the system includes a multi-die package, and wherein the frequency generator is formed on a first die of the package, the ADC is formed on a second die of the package, and the power converter is distributed among the first die, the second die, and a third die, the power converter comprising a transformer to achieve electrical isolation between at least two of the dies among which the power converter is distributed; wherein the power signal is at least partially a direct current (DC) signal comprising an alternating current (AC) component, the AC component corresponding to the second frequency; wherein the frequency generator is selected from the group consisting of: a phase-locked loop (PLL), a delay-locked loop (DLL), a frequency-locked loop (FLL), and a frequency divider; further comprising a data transmitter configured to transmit outputs of the ADC via an electrical isolation barrier to a data receiver; wherein the system has a physical configuration selected from the group consisting of: the frequency generator, the power converter, and the ADC housed in a single package; the frequency generator, the ADC, and a first portion of the power converter housed in a first package with a second portion of the power converter housed in a second package; the frequency generator and the ADC housed in a first package, a transformer portion of the power converter housed in a second package, and a non-transformer portion of the power converter housed in a third package; wherein the ADC is configured to sample the analog voltages across a shunt resistor.

At least some embodiments are directed to a system comprising a phase-locked loop (PLL) configured to generate a second clock signal having a second frequency based on a first clock signal having a first frequency. The system also includes a power converter configured to produce a power signal that corresponds at least in part to the second frequency. The system further comprises a clock transmitter configured to transmit the first clock signal through a first electrical isolation barrier. The system further includes a clock receiver configured to receive the first clock signal from the clock transmitter. The system also comprises an analog-to-digital converter (ADC) configured to receive the first clock signal from the clock receiver and to sample and convert electrical measurements at the first frequency. The ADC is powered by the power signal. The system still further comprises a data transmitter configured to receive an output of the ADC and to transmit the output of the ADC via a second electrical isolation barrier. The system also includes a data receiver configured to receive the output of the ADC from the data transmitter and to direct the received output of the ADC toward a device pin. The second frequency is offset from the first frequency and each of a plurality of harmonic frequencies of the second frequency is offset from at least one harmonic frequency of the first frequency. Some such embodiments may be supplemented using one or more of the following concepts, in any order and in any combination: further comprising a shunt resistor and an amplifier receiving a voltage across the shunt resistor, the electrical measurements comprise the voltage across the shunt resistor; wherein the power converter comprises a laminated transformer that electrically isolates one portion of the power converter from another portion of the power converter; wherein the PLL is configured to produce a third clock signal at a third frequency and to provide the third clock signal to the clock transmitter, and wherein the clock transmitter is configured to transmit the first clock signal to the clock receiver at the third frequency; wherein the power signal comprises a direct current (DC) component and an alternating current (AC) component, the AC component corresponding to the second frequency; further comprising a pair of capacitors forming at least a portion of the first isolation barrier and another pair of capacitors forming at least a portion of the second isolation barrier.

At least some embodiments are directed to a method that comprises using a frequency generator to generate a second clock signal at a second frequency based on a first clock signal at a first frequency. The first and second frequencies are offset from each other by target margins. The method also comprises generating a power signal having a direct current (DC) component and an alternating current (AC) component. The AC component corresponds to the second frequency. The method also includes powering an analog-to-digital converter (ADC) with the power signal and sampling voltages at the first frequency using the ADC. The method further includes transmitting the sampled voltages across an electrical isolation barrier toward a device output pin. Some such embodiments may be supplemented using one or more of the following concepts, in any order and in any combination: wherein generating a power signal comprises using a power converter having a laminated transformer to electrically isolate different portions of the power converter from each other; further comprising electrically isolating the frequency generator and the ADC from each other.

BRIEF DESCRIPTION OF THE DRAWINGS

For a detailed description of various examples, reference will now be made to the accompanying drawings, in which.

DETAILED DESCRIPTION

At least some of the embodiments disclosed herein are directed to a current-sensing device that remedies the aforementioned problems. The device comprises an analog-to-digital converter (ADC) configured to sample and convert shunt resistor voltage measurements at a first frequency of a first clock signal. The ADC is mounted on a die that is electrically isolated from other portions of the device. The device further comprises an integrated power supply that supplies a power signal to the ADC at a second frequency that is offset from the first frequency such that the harmonics of the two frequencies avoid overlap. At least a portion of the integrated power supply may be electrically isolated from other portions of the device. Because the first and second frequencies are appropriately offset from each other, and further because at least some of the harmonics of the first frequency are appropriately offset from the corresponding harmonics of the second frequency, noise and aliasing problems are mitigated. The device may comprise a phase-locked loop (PLL) to generate clock signals at the first and second frequencies. The device may comprise a pin through which the shunt resistor voltage measurements may be output. The voltage measurements may subsequently be used as desired—for instance, to calculate a current flowing through the shunt resistor using the measured voltage, the shunt resistor resistance, and Ohm's law.

Figure 1:
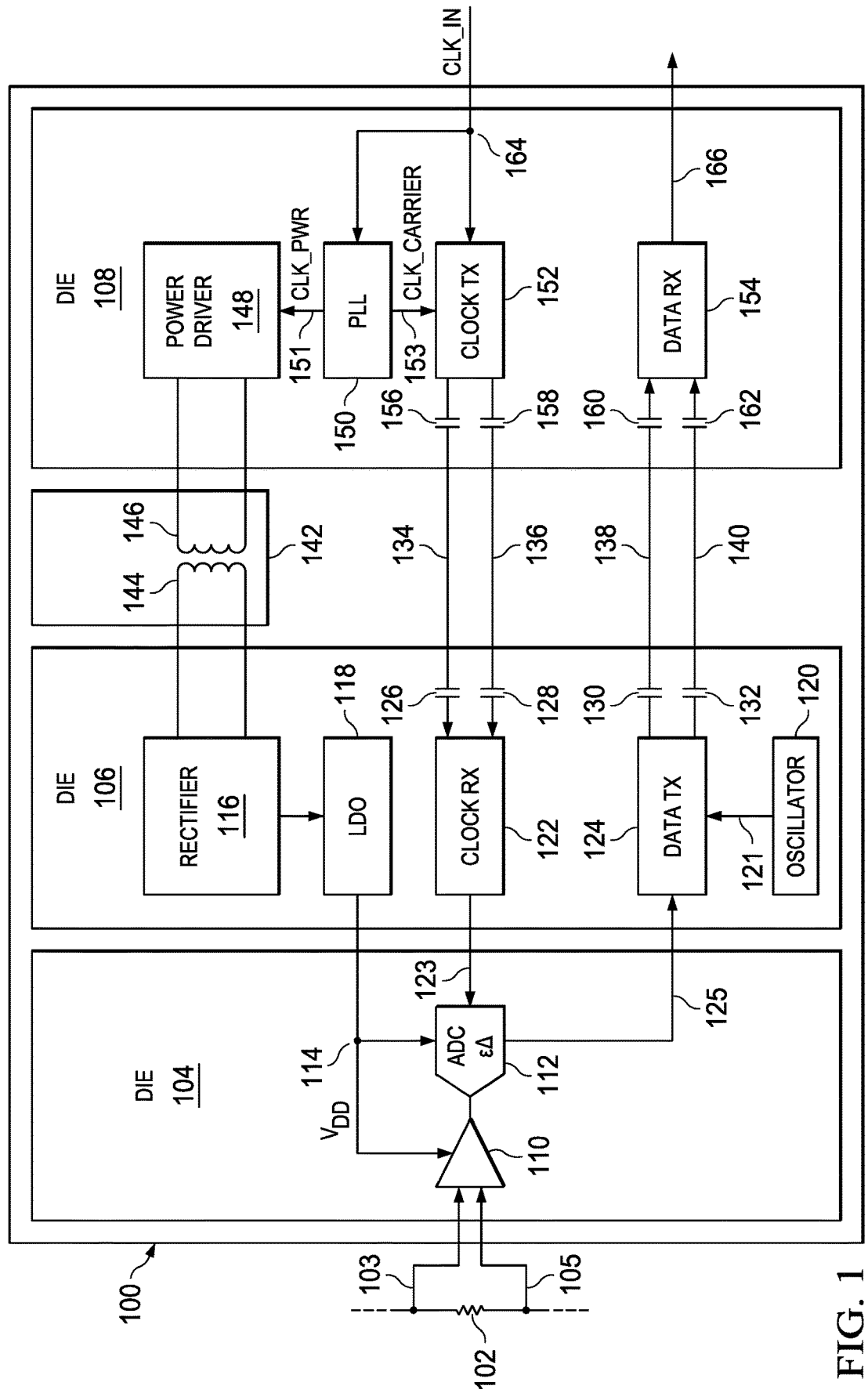
FIG. 1 is a block diagram of an illustrative current-sensing system in accordance with embodiments.

FIG. 1 is a block diagram of an illustrative current-sensing system in accordance with embodiments. The system includes a device 100 that may house various components. The device 100 may be any suitable type of package, including and without limitation, a through-hole package; a surface mount package; a pin grid array; a flat package; a small outline package; a ball grid array package; and the like. In at least some embodiments, the device 100 (e.g., a package) may house multiple dies, with at least one die having one or more physical, electrical connections to another die, to one or more package leads or pins, or both, and/or at least one die having one or more electrical communications with another die (e.g., via a transformer or capacitor-based electrical isolation barrier). In the illustrative embodiment depicted in FIG. 1, the device 100 comprises three dies 104, 106, and 108, although the scope of disclosure is not limited to any particular number or physical or electrical configuration of dies.

An amplifier (e.g., an instrumentation amplifier (INA)) 110 and an ADC 112 may be mounted on or formed on the die 104. Other types of amplifiers are contemplated, and the ADC 112 may be any suitable type of ADC, such as a sigma-delta ADC. The amplifier 110 may be a differential amplifier that receives inputs via connections 103 and 105. Connections 103 and 105, as depicted in FIG. 1, may couple to opposing ends of a shunt resistor 102 so that the voltage present across the shunt resistor 102 is provided to the amplifier 110.

An oscillator 120, a clock receiver 122, and a data transmitter 124 are mounted on or formed on the die 106. The oscillator 120 couples to the data transmitter 124 via connection 121. (The die 106 additionally supports or includes a rectifier 116 and a low-dropout regulator (LDO) 118, but these are described further below.) The clock receiver 122 couples to the ADC 112 via the connection 123, and the data transmitter 124 couples to the ADC 112 via the connection 125. The connections 123 and 125, as with some or all connections between the dies in the device 100, may comprise any suitable type of connection, such as wire bonds.

A clock transmitter 152 and a data receiver 154 are mounted on or formed on the die 108. The clock transmitter 152 couples to connection 164 which may be, for instance, an input pin to the device 100. The connection 164 may provide the clock transmitter 152 with an input clock signal CLK_IN (e.g., at 20 MHz). The clock transmitter 152 communicates with the clock receiver 122 via an electrical isolation barrier that assists in electrically isolating the die 108 from the die 106. Specifically, the electrical isolation barrier comprises capacitors 156 and 126 (e.g., 0.5 pico Farads) and a connection 134 between the capacitors 156 and 126. The dielectrics associated with the capacitors 156 and 126 effectively cause the clock transmitter 152 and the clock receiver 122 to be electrically isolated from each other. Similarly, the electrical isolation barrier comprises capacitors 158 and 128 and a connection 136 between the capacitors 128 and 158. Likewise, the electrical isolation barrier comprises capacitors 160 and 130 and a connection 138 therebetween, as well as a pair of capacitors 162 and 132 and a connection 140 therebetween. Thus, the terms "electrical isolation barrier," "electrically isolated," and the like as used herein generally refer to the galvanic isolation between dies and/or components and does not exclude the possibility of electrical communications through, e.g., capacitor dielectrics and/or transformers. Communication between the clock transmitter 152 and clock receiver 122 may be differential in nature, and communication between the data transmitter 124 and the data receiver 154 also may be differential in nature. The data receiver 154 couples to a connection 166, which in at least some embodiments is or couples to an output data pin of the device 100.

The die 108 additionally comprises a frequency generator. In this disclosure, the frequency generator is frequently referred to as a phase-locked loop (PLL), such as PLL 150 in FIG. 1. The scope of disclosure, however, is not limited to PLL-type frequency generators. Other types of frequency generators may be used, such as and without limitation, delay-locked loops (DLLs), frequency-locked loops (FLLs), and/or frequency dividers. These and other types of frequency generators are contemplated and included within the scope of this disclosure. The PLL 150 receives the input clock signal CLK_IN via connection 164, and it may output differing clock signals 151 (CLK_PWR) and 153 (CLK- _CARRIER). The PLL 150 provides the clock signal 153 (CLK_CARRIER) to the clock transmitter 152, and the PLL 150 provides the clock signal 151 (CLK_PWR) to a power driver circuit 148, which is also mounted on or formed on the die 108.

The power driver circuit 148 may couple to coil 146 and transformer 142. The transformer 142 (e.g., comprising laminate) may additionally include a coil 144 that couples to the rectifier 116. In turn, the rectifier 116 may couple to the LDO 118, and the LDO 118 may couple to the amplifier 110 and the ADC 112 via connection 114. The power driver 148, the transformer 142, the rectifier 116, and the LDO 118 may together constitute an integrated power subsystem for powering portions of the device 100 (e.g., the amplifier 110 and/or the ADC 112).

In operation, the device 100 may receive the input clock signal CLK_IN via the connection 164. The input clock signal CLK_IN (e.g., 20 MHz) is provided to the PLL 150. The PLL 150, in turn, uses multiple clock dividers to produce at least two different clock signals: the clock signal 153 (CLK_CARRIER), which is provided to the clock transmitter 152, and the clock signal 151 (CLK_PWR), which is provided to the power driver circuit 148. In at least some embodiments, the PLL 150 is configured to produce a clock signal 151 (CLK_PWR) having a frequency that is offset from the input clock signal (CLK_IN) frequency as appropriate to avoid generating undue noise and to avoid aliasing between signals in the device 100, as will be described further below. The target offsets between clock signal frequencies may be determined by, e.g., an engineer who designs the PLL 150 and/or the device 100. In at least some embodiments, an input clock signal CLK_IN with a frequency of 20 MHz results in a clock signal 151 (CLK_PWR) that is in the range of 21.5 MHz and 28.5 MHz, inclusive. In at least some embodiments, the frequencies of the clock signal 151 (CLK_PWR) and input clock signal CLK_IN are offset such that at least some harmonic frequencies of one of the clock signals do not fall within a predetermined range of at least some of the harmonic frequencies of the other clock signal. For example, if the input clock signal CLK_IN is 20 MHz, its harmonic frequencies may include 40 MHz and 60 MHz. Accordingly, in this example, the PLL 150 may produce a clock signal 151 (CLK_PWR) that is 21.5 MHz, whose corresponding harmonic frequencies may include 43 MHz and 86 MHz, respectively. The PLL 150 might not, however, produce a clock signal 151 (CLK_PWR) that is too close to 30 MHz, as the second harmonic frequency of the clock signal 151 (CLK_PWR) would be 60 MHz, which would interfere with the third harmonic frequency of the input clock signal CLK_IN. The clock signal 153 (CLK_CARRIER) is used by the clock transmitter 152 to transmit the input clock signal CLK_IN to the clock receiver 122 and thus may be selected as appropriate (e.g., 400 MHz-500 MHz, inclusive).

As mentioned, the clock transmitter 152 uses the clock signal 153 (CLK_CARRIER) to transmit the input clock signal CLK_IN received via connection 163 to the clock receiver 122 via the electrical isolation barrier. Specifically, the clock transmitter 152 may use the frequency of the clock signal 153 (CLK_CARRIER) as the carrier and transmits the input clock signal CLK_IN on this carrier. Thus, the signal that the clock transmitter 152 transmits to the clock receiver 122 may be a 400-500 MHz signal (e.g., the clock signal 153, CLK_CARRIER) that is switched on and off at the 20 MHz rate (e.g., the input clock signal CLK_IN). The clock receiver 122 receives the input clock signal CLK_IN and provides the input clock signal CLK_IN (e.g., 20 MHz) to the ADC 112 via the connection 123.

As explained, the PLL 150 generates the clock signal 151 (CLK_PWR) and provides the clock signal 151 (CLK_PWR) to the integrated power subsystem—specifically, to the power driver circuit 148. The power driver circuit 148 uses the clock signal 151 (CLK_PWR) to drive the transformer 142. The transformer 142 may comprise laminate which assists in electrical isolation of the dies 106 and 108 and, thus, electrical isolation of different components of the power subsystem. The rectifier 116 rectifies the received power signal to a primarily direct current (DC) signal, and the LDO 118 "flattens" the signal to remove most of the alternating current (AC) elements remaining in the power signal. The LDO 118 subsequently provides the primarily DC power signal ($V_{DD}$) to the amplifier 110 and the ADC 112 via connection 114.

The ADC 112 thus receives a power signal VDD that has a small AC component remaining at a frequency corresponding to that of the clock signal 151 (CLK_PWR) (e.g., 21.5 MHz), and the ADC 112 receives a data sampling clock signal that has a frequency corresponding to that of the input clock signal CLK_IN at connection 164 (e.g., 20 MHz). Accordingly, the power signal frequency (CLK_PWR) is sufficiently separated from the data sampling clock signal (CLK_IN) frequency that noise and aliasing problems between these two signals are mitigated. Additionally, because these frequencies are selected to avoid overlap between their harmonic frequencies, noise and aliasing problems are further mitigated. These advantages are achieved while maintaining the electrical isolation barrier between the dies 106 and 108 and with a power subsystem integrated within the device 100.

The ADC 112 outputs digital measurements of the voltage across the shunt resistor 102 on the connection 125. The data transmitter 124 receives these measurements and transmits them to the data receiver 154 via the electrical isolation barrier using the carrier signal (e.g., 400 MHz-500 MHz, inclusive) provided by the oscillator 120 via connection 121. In some embodiments, the frequency of the oscillator 120 is identical to or within a predetermined range of the frequency of the clock signal 153 (CLK_CARRIER). The data receiver 154 receives the data from the data transmitter 124 and outputs the data via connection 166. The connection 166 is or may be coupled to a device lead or pin.

Implementation of the embodiments described herein is not limited to sensing voltages across a shunt resistor. Rather, the disclosed embodiments may be implemented in any application in which there is a potential risk of interference between ADC data sampling frequency and ADC power frequency. All such implementations and applications are contemplated and included within the scope of this disclosure.

As described above, the device 100 may—in some embodiments—take the form of a single, integrated package. However, in other embodiments, the contents of the device 100 may be distributed between multiple different packages. For example, in some embodiments, the PLL 150, the ADC 112, and a portion of the power converter (e.g., the power driver 148, the rectifier 116, and the LDO 118) may be housed in a first package, with another portion of the power converter (e.g., the transformer 142 with coils 144 and 146) housed in a second, separate package. In such embodiments, the remaining components may be distributed between the two packages as desired and as may be appropriate. In still other embodiments, the PLL 150 and the ADC 112 may be housed within a first package, a portion of the power converter (e.g., the power driver 148, the rectifier 116, and the LDO 118) may be housed in a second package, and another portion of the power converter (e.g., the transformer 142 with coils 144 and 146) may be housed in a third package. The remainder of the components may be distributed between the three packages as desired and as may be appropriate. The scope of disclosure is not limited to the component distributions expressly described herein. Other distributions will become apparent to one of ordinary skill in the art having the benefit of this disclosure, and all such distributions are contemplated and included within the scope of this disclosure.

Figure 2:
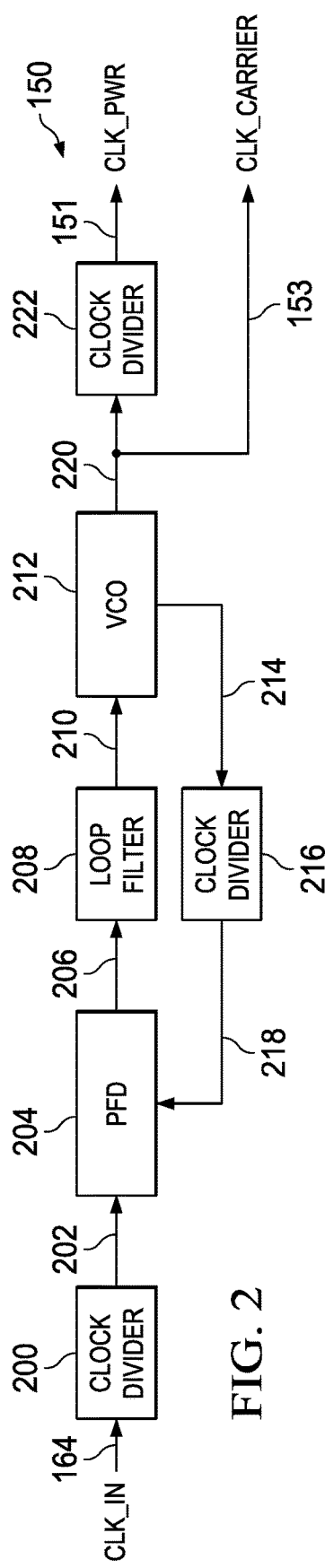
FIG. 2 is a block diagram of an illustrative phase-locked loop (PLL) that may be implemented in the current-sensing system of FIG. 1, in accordance with embodiments.

FIG. 2 is a block diagram of a phase-locked loop (PLL) 150 that may be implemented in the current-sensing system of FIG. 1, in accordance with embodiments. FIG. 2 depicts the input clock signal connection 164 (CLK_IN), which couples to a clock divider 200 (which divides an incoming signal by, e.g., 8). In some embodiments, the PLL 150 includes the clock divider 200. In other embodiments, the PLL 150 includes some or all of the remainder of the components depicted in FIG. 2 other than the clock divider 200 and the connection 164. In any event, the PLL 150 may comprise a connection 202 between the clock divider 200 and a phase frequency detector (PFD) 204. The PLL 150 may further comprise a loop filter 208, which, in turn, may include a charge pump and/or additional filtering components. A connection 206 couples the PFD 204 and the loop filter 208. The PLL 150 may further include a voltage-controlled oscillator (VCO) 212 and a connection 210 coupling the loop filter 208 to the VCO 212. The PLL 150 may still further comprise a clock divider 216 (which divides an incoming signal by, e.g., 172) in a feedback loop between the VCO 212 and the PFD 204. The clock divider 216 may couple to the VCO 212 via a connection 214 and to the PFD 204 via a connection 218. The PLL 150 also may include a clock divider 222 (which divides an incoming signal by, e.g., 20), which may couple to the VCO 212 via node 220. The clock divider 222 outputs the clock signal 151 (CLK_PWR), and the VCO 212 outputs the clock signal 153 (CLK_CARRIER), both of which are described above.

In operation, the clock divider 200 may receive an illustrative input clock signal CLK_IN of 20 MHz. The clock divider 200 may divide this frequency of 20 MHz by 8, resulting in a signal on connection 202 of 2.5 MHz. The PFD 204 compares the signal on connection 202, which serves as a reference signal, to the feedback signal received on connection 218, which serves as an indication of the output of the VCO 212. When the PLL 150 is locked, the VCO 212 output may be approximately 430 MHz, which, when divided by an illustrative factor of 172 in the clock divider 216, results in a feedback signal on connection 218 of 2.5 MHz. The loop filter 208 processes the output of the PFD 204 present on connection 206 and provides its output to the VCO 212 via connection 210, and the VCO 212 may adjust its output frequency accordingly. As explained, when the PLL is locked, the output of the VCO 212 may be a signal with a 430 MHz frequency, and this signal may be output as the clock signal 153 (CLK_CARRIER). When divided by the clock divider 222 by an illustrative factor of 20, a signal of frequency 21.5 MHz may be generated, and this signal may be output as the clock signal 151 (CLK_PWR). These clock signals 151 (CLK_PWR) and 153 (CLK_CARRIER) may subsequently be used as explained in detail above. The scope of disclosure is not limited to the precise PLL architecture depicted in FIG. 2. Different types of PLLs may be implemented in the device 100, so long as the functionalities described herein are achieved. Similarly, the scope of disclosure is not limited to the illustrative frequencies described herein. Any suitable frequencies may be provided to the device 100 via the connection 164, and any suitable frequencies may be generated by the PLL 150 and the oscillator 120.

Figure 3:
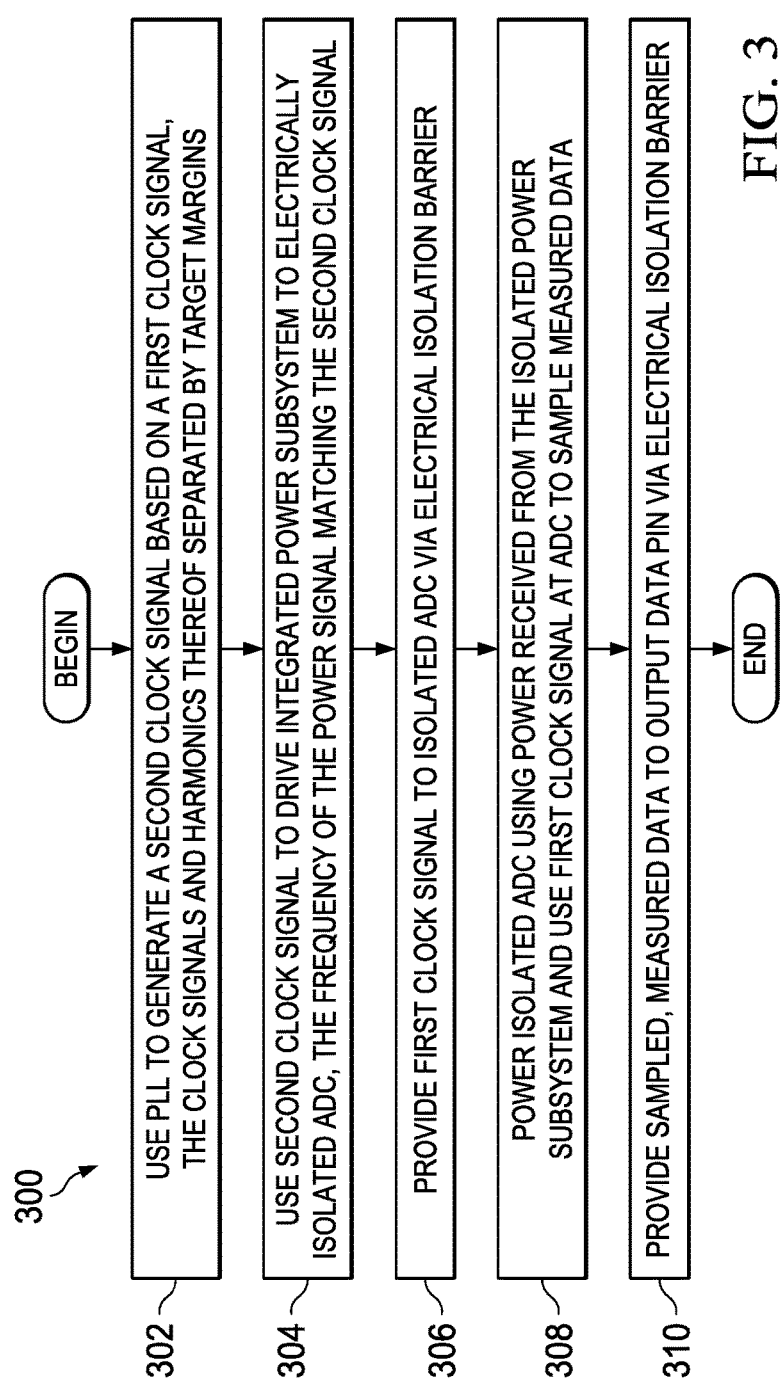
FIG. 3 is a flow diagram of an illustrative method in accordance with embodiments.

FIG. 3 is a flow diagram of a method 300 in accordance with embodiments. The method 300 may comprise using a PLL to generate a second clock signal (e.g., signal 151 (CLK_PWR) in FIG. 1) based on a first clock signal (e.g., the input clock signal on connection 164 (CLK_IN) in FIG. 1), where the clock signal frequencies and harmonic frequencies of the clock signal frequencies are offset from each other by one or more minimum target margins (step 302). The method 300 may further comprise using the second clock signal (CLK_PWR) to drive an integrated power subsystem (e.g., components 148, 142, 116, and 118 in FIG. 1) to an electrically isolated ADC (e.g., ADC 112 in FIG. 1), where the frequency of the power signal matches the second clock signal (CLK_PWR) (step 304). The method 300 may subsequently include providing the first clock signal (CLK_IN) to the electrically isolated ADC via an electrical isolation barrier (step 306). The method 300 may then include powering the isolated ADC using the power signal received from the integrated power subsystem and using the first clock signal CLK_IN at the ADC to sample measured voltage data across a shunt resistor (block 308). Finally, the method 300 may comprise providing the sampled, measured data to an output data pin via the electrical isolation barrier (step 310). The method 300 may be modified as desired, including by adding, deleting, modifying, or rearranging one or more steps.

The above discussion is meant to be illustrative. Numerous variations and modifications will become apparent to those skilled in the art once the above disclosure is fully appreciated. It is intended that the following claims be interpreted to embrace all such variations and modifications.

What is claimed is:

1. A system, comprising:
   a phase-locked loop (PLL) configured to generate a second clock signal having a second frequency based on a first clock signal having a first frequency;
   a power converter configured to produce a power signal that corresponds at least in part to the second frequency;
   a clock transmitter configured to transmit the first clock signal through a first electrical isolation barrier;
   a clock receiver configured to receive the first clock signal from the clock transmitter;
   an analog-to-digital converter (ADC) configured to receive the first clock signal from the clock receiver and to sample and convert electrical measurements at the first frequency, the ADC powered by the power signal;
   a data transmitter configured to receive an output of the ADC and to transmit the output of the ADC via a second electrical isolation barrier; and
   a data receiver configured to receive the output of the ADC from the data transmitter and to direct the received output of the ADC toward a device pin,
   wherein the second frequency is offset from the first frequency and each of a plurality of harmonic frequencies of the second frequency is offset from at least one harmonic frequency of the first frequency.

2. The system of claim 1, further comprising a shunt resistor and an amplifier receiving a voltage across the shunt resistor, the electrical measurements comprise the voltage across the shunt resistor.

3. The system of claim 1, wherein the power converter comprises a laminated transformer that electrically isolates one portion of the power converter from another portion of the power converter.

* * * * *